United States Patent
Xiao et al.

(10) Patent No.: US 10,121,433 B2
(45) Date of Patent: *Nov. 6, 2018

(54) GOA CIRCUIT AND METHOD FOR DRIVING THE SAME AND LCD

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventors: Juncheng Xiao, Guangdong (CN); Ronglei Dai, Guangdong (CN); Shangcao Cao, Guangdong (CN); Yao Yan, Guangdong (CN)

(73) Assignees: Shenzhen China Star Optoelectronics Technology Co., Ltd, Shenzhen, Guangdong (CN); Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 367 days.

This patent is subject to a terminal disclaimer.

(21) Appl. No.: 14/895,601

(22) PCT Filed: Nov. 6, 2015

(86) PCT No.: PCT/CN2015/093975
§ 371 (c)(1),
(2) Date: Dec. 3, 2015

(87) PCT Pub. No.: WO2017/049742
PCT Pub. Date: Mar. 30, 2017

(65) Prior Publication Data
US 2017/0256219 A1 Sep. 7, 2017

(30) Foreign Application Priority Data

Sep. 23, 2015 (CN) .......................... 2015 1 0611786

(51) Int. Cl.
*G09G 3/36* (2006.01)

(52) U.S. Cl.
CPC ......... *G09G 3/3677* (2013.01); *G09G 3/3648* (2013.01); *G09G 2300/0408* (2013.01);
(Continued)

(58) Field of Classification Search
CPC .............. G09G 3/3677; G09G 3/3648; G09G 2330/026; G09G 2310/0218; G09G 2300/0408; G09G 2310/08
See application file for complete search history.

(56) References Cited

U.S. PATENT DOCUMENTS 7,486,269 B2   2/2009   Moon
8,179,355 B2   5/2012   Lee
(Continued)

FOREIGN PATENT DOCUMENTS

CN   104766584 A   11/2016
CN   105118465 A   3/2017

*Primary Examiner* — Kumar Patel
*Assistant Examiner* — Amy C Onyekaba
(74) *Attorney, Agent, or Firm* — Andrew C. Cheng

(57) ABSTRACT

A gate on array (GOA) circuit for used in an LCD includes GOA units connected in cascade. An Nth GOA unit includes an Nth stage-transmittance circuit, an Nth Q-node controlling circuit, an Nth P-node controlling circuit, an Nth outputting circuit, and a first switch circuit where N is a positive integer. The first switch circuit connected to the Nth scanning line, for inputting an enabling signal to the Nth scanning line before the LCD shows images so as to turn on a TFT in a pixel which the Nth scanning line is connected to. The benefit of the function is that the display does not leak electricity when the black screen is woken up and that the stability of the circuit is enhanced at the same time.

14 Claims, 4 Drawing Sheets

(52) U.S. Cl.
CPC . *G09G 2310/0218* (2013.01); *G09G 2310/08* (2013.01); *G09G 2330/026* (2013.01)

(56) References Cited

U.S. PATENT DOCUMENTS

| | | | |
|---|---|---|---|
| 9,218,780 B2 | 12/2015 | Chen | |
| 9,383,841 B2 | 6/2016 | Lin | |
| 2013/0063404 A1 | 3/2013 | Jamshidi Roudbari | |
| 2013/0155044 A1* | 6/2013 | Ohkawa | G09G 3/3677 345/211 |
| 2014/0146026 A1 | 5/2014 | Yu | |
| 2015/0009113 A1* | 1/2015 | Zeng | G09G 3/3677 345/100 |
| 2016/0188074 A1 | 6/2016 | Xiao | |
| 2016/0189584 A1 | 6/2016 | Xiao | |
| 2016/0189586 A1* | 6/2016 | Zou | G09G 3/3266 345/213 |
| 2016/0189647 A1 | 6/2016 | Xiao | |
| 2016/0300623 A1* | 10/2016 | Yang | G11C 19/28 |
| 2016/0358586 A1 | 12/2016 | Song | |
| 2017/0178581 A1* | 6/2017 | Li | G09G 3/3655 |

* cited by examiner

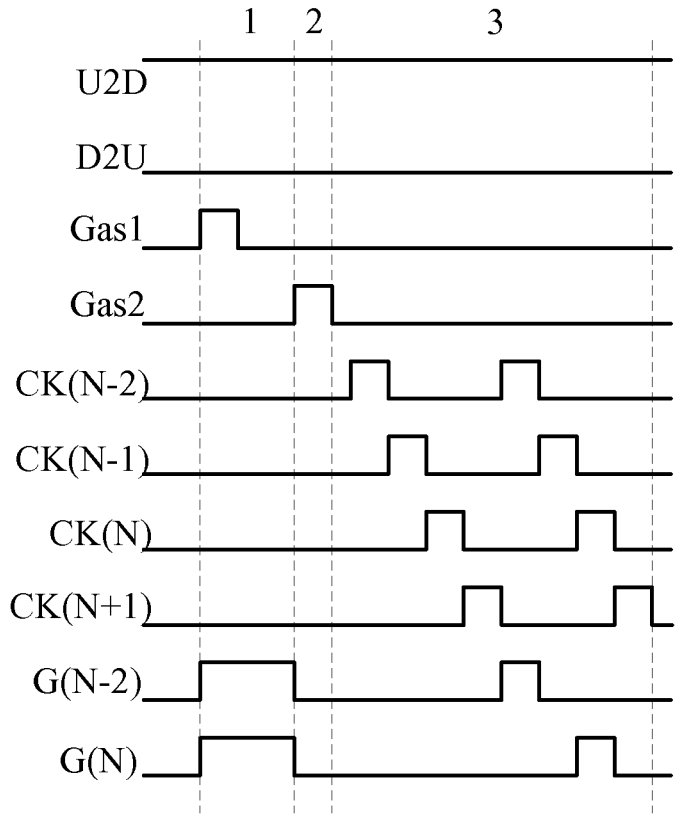

GOA CIRCUIT AND METHOD FOR DRIVING THE SAME AND LCD

BACKGROUND OF THE INVENTION

1. Field of the Invention

The present invention relates to the field of display technology, and more particularly, to a gate on array (GOA) circuit, a method for driving the GOA circuit, and a liquid crystal display (LCD).

2. Description of the Prior Art

A gate on array (GOA) circuit is produced by adopting the process of fabricating a thin-film transistor liquid crystal display (TFT-LCD) array. A circuit for a driving signal in a row of gates is fabricated on an array substrate for conducting scanning the gates row by row. Compared with the conventional chip on flex (COF) and chip on glass (COG), the GOA circuit is cost effective in production. Besides, the bonding of orientation of the gates is unnecessary. The GOA circuit is highly beneficial for the capacity and the integrity of the LCD.

Practically, signal suspension is necessary for the GOA circuit to satisfy the need of a touch panel, for example, when the touch panel scans, since the LCD usually works with the touch panel. In general, after signal suspension of the GOA circuit, the black screen of the LCD needs to be waken up. All of the gates on the GOA circuit need to be conducted in a certain period of time. A black voltage is imposed on the data lines to clear the remaining level in the capacity of the pixel. The LCD can have a good effect on display. This period is the all-gate-on stage. The conventional GOA circuit may disable during the all-gate-on stage. In other words, all-gate-on function cannot be definitely realized in the conventional technology.

SUMMARY OF THE INVENTION

An object of the present invention is to propose a GOA circuit, a method for driving the GOA circuit, and an LCD for turning on a gate of each pixel, inputting a signal at low level, preventing the display from leaking electricity when the black screen of the display is woken up, and improving the stability of the circuit when the black screen is woken up.

According to the present invention, a gate on array (GOA) circuit for liquid crystal display (LCD) comprises: a plurality of GOA units connected in cascade, an Nth GOA unit comprising an Nth stage-transmittance circuit, an Nth Q-node controlling circuit, an Nth P-node controlling circuit, an Nth outputting circuit, and a first switch circuit where N is a positive integer. The Nth stage-transmittance circuit is connected to the Nth Q-node controlling circuit. The Nth Q-node controlling circuit is connected to the Nth outputting circuit via the Q node. The Nth stage-transmittance circuit is connected to the Nth P-node controlling circuit. The Nth P-node controlling circuit is connected to the Nth outputting circuit via the P node. The Nth outputting circuit is connected to the Nth scanning line. The first switch circuit connected to the Nth scanning line, for inputting an enabling signal to the Nth scanning line before the LCD shows images so as to turn on a thin-film transistor (TFT) in a pixel which the Nth scanning line is connected to.

Furthermore, the first switch circuit comprises a first TFT, a source of the first TFT is connected to the Nth scanning line, a gate of the first TFT receives a first enabling signal at high level before the LCD shows images so as to turn on the source of the first TFT and a drain of the first TFT and transmits a signal at high level to the Nth scanning line so as to turn on the TFT in the pixel which the Nth scanning line is connected to.

Furthermore, the GOA unit further comprises a second switch circuit;

the second switch circuit comprising a second TFT, a drain of the second TFT connected to the Nth scanning line, and the second switch circuit receiving a second enabling signal at high level from a gate of the second TFT so as to turn on the source of the second TFT and a drain of the second TFT and transmitting a signal at low level to the Nth scanning line after transmitting a signal at high level to the Nth scanning line so as to turn off the TFT in the pixel which the Nth scanning line is connected to.

Furthermore, the Nth stage-transmittance circuit comprises a third TFT, a fourth TFT, a fifth TFT, and a sixth TFT. A gate of the third TFT and a gate of the fourth TFT receives a forward scanning controlling signal, for receiving an (N−2)th scanning signal through the third TFT in the period of forward scanning, and for receiving an (N+1)th clock signal through the fourth TFT. A gate of the fifth TFT and a gate of the sixth TFT receives a reverse scanning controlling signal, for receiving an (N+2)th scanning signal through the fifth TFT in the period of reverse scanning, and for receiving an (N−1)th clock signal through the sixth TFT.

Furthermore, the Nth Q-node controlling circuit comprises: a seventh TFT, an eighth TFT, and a ninth TFT. A gate of the seventh TFT receives an (N−2)th clock signal. A drain of the seventh TFT receives an (N−2)th scanning signal in the period of forward scanning or receiving an (N+2)th scanning signal in the period of reverse scanning. A source of the seventh TFT is connected to the Q node. A gate of the eighth TFT receives an (N−2)th scanning signal G(N−2). A drain of the eighth TFT is connected to the P node, and a source of the eighth TFT receives a signal at low level. A gate of the ninth TFT is connected to the drain of the eighth TFT, a drain of the ninth TFT is connected to the source of the seventh TFT, and a source of the ninth TFT is connected to a signal at low level.

Furthermore, the Nth P-node controlling circuit comprises: a tenth TFT, a gate of the tenth TFT receiving an (N+1)th clock signal in the period of forward scanning or receiving an (N−2)th clock signal in the period of reverse scanning, a drain of the tenth TFT receiving a signal at high level, and a source of the tenth TFT connected to the P node; an eleventh TFT, a gate of the eleventh TFT connected to the Q node, a drain of the eleventh TFT connected to the P node, and a source of the eleventh TFT receiving a signal at low level.

Furthermore, the Nth P-node controlling circuit further comprises: a twelfth TFT, a gate of the twelfth receiving the first enabling signal, a drain of the twelfth connected to the P node, and a source of the twelfth TFT receiving a signal at low level.

Furthermore, the Nth outputting circuit comprises: a thirteenth TFT, a gate of the thirteenth TFT connected to the Q node, a drain of the thirteenth TFT receiving an Nth clock signal, and a source of the thirteenth TFT connected to the Nth scanning line; a fourteenth TFT, a gate of the fourteenth TFT connected to the P node, a drain of the fourteenth TFT connected to the Nth scanning line, and a source of the fourteenth TFT connected to a signal at low level.

According to the present invention, a method for driving a gate on array (GOA) circuit is proposed. The GOA circuit comprises: a plurality of GOA units connected in cascade, N set as a positive integer, wherein an Nth GOA unit comprises a first switch circuit, and the first switch circuit is connected to an Nth scanning signal. The method comprises steps of: turning on a first switch circuit in the GOA unit at each stage and inputting an enabling signal to the scanning line at each stage so that a thin-film transistor (TFT) in a pixel connected to the scanning line at each stage is turned on; turning off the switch circuit in the GOA unit at each stage and starting to scan the GOA unit from the first stage or from the last stage.

According to the present invention, a liquid crystal display (LCD) comprises a gate on array (GOA) circuit. The GOA circuit comprises: a plurality of GOA units connected in cascade, an Nth GOA unit comprising an Nth stage-transmittance circuit, an Nth Q-node controlling circuit, an Nth P-node controlling circuit, an Nth outputting circuit, and a first switch circuit where N is a positive integer. The Nth stage-transmittance circuit is connected to the Nth Q-node controlling circuit. The Nth Q-node controlling circuit is connected to the Nth outputting circuit via the Q node. The Nth stage-transmittance circuit is connected to the Nth P-node controlling circuit. The Nth P-node controlling circuit is connected to the Nth outputting circuit via the P node. The Nth outputting circuit is connected to the Nth scanning line. The first switch circuit connected to the Nth scanning line, for inputting an enabling signal to the Nth scanning line before the LCD shows images so as to turn on a thin-film transistor (TFT) in a pixel which the Nth scanning line is connected to.

Furthermore, the first switch circuit comprises a first TFT, a source of the first TFT is connected to the Nth scanning line, a gate of the first TFT receives a first enabling signal at high level before the LCD shows images so as to turn on the source of the first TFT and a drain of the first TFT and transmits a signal at high level to the Nth scanning line so as to turn on the TFT in the pixel which the Nth scanning line is connected to.

Furthermore, the GOA unit further comprises a second switch circuit;

the second switch circuit comprising a second TFT, a drain of the second TFT connected to the Nth scanning line, and the second switch circuit receiving a second enabling signal at high level from a gate of the second TFT so as to turn on the source of the second TFT and a drain of the second TFT and transmitting a signal at low level to the Nth scanning line after transmitting a signal at high level to the Nth scanning line so as to turn off the TFT in the pixel which the Nth scanning line is connected to.

Furthermore, the Nth stage-transmittance circuit comprises a third TFT, a fourth TFT, a fifth TFT, and a sixth TFT. A gate of the third TFT and a gate of the fourth TFT receives a forward scanning controlling signal, for receiving an (N−2)th scanning signal through the third TFT in the period of forward scanning, and for receiving an (N+1)th clock signal through the fourth TFT. A gate of the fifth TFT and a gate of the sixth TFT receives a reverse scanning controlling signal, for receiving an (N+2)th scanning signal through the fifth TFT in the period of reverse scanning, and for receiving an (N−1)th clock signal through the sixth TFT.

Furthermore, the Nth Q-node controlling circuit comprises: a seventh TFT, an eighth TFT, and a ninth TFT. A gate of the seventh TFT receives an (N−2)th clock signal. A drain of the seventh TFT receives an (N−2)th scanning signal in the period of forward scanning or receiving an (N+2)th scanning signal in the period of reverse scanning. A source of the seventh TFT is connected to the Q node. A gate of the eighth TFT receives an (N−2)th scanning signal G(N−2). A drain of the eighth TFT is connected to the P node, and a source of the eighth TFT receives a signal at low level. A gate of the ninth TFT is connected to the drain of the eighth TFT, a drain of the ninth TFT is connected to the source of the seventh TFT, and a source of the ninth TFT is connected to a signal at low level.

Furthermore, the Nth P-node controlling circuit comprises: a tenth TFT, a gate of the tenth TFT receiving an (N+1)th clock signal in the period of forward scanning or receiving an (N−2)th clock signal in the period of reverse scanning, a drain of the tenth TFT receiving a signal at high level, and a source of the tenth TFT connected to the P node; an eleventh TFT, a gate of the eleventh TFT connected to the Q node, a drain of the eleventh TFT connected to the P node, and a source of the eleventh TFT receiving a signal at low level.

Furthermore, the Nth P-node controlling circuit further comprises: a twelfth TFT, a gate of the twelfth receiving the first enabling signal, a drain of the twelfth connected to the P node, and a source of the twelfth TFT receiving a signal at low level.

Furthermore, the Nth outputting circuit comprises: a thirteenth TFT, a gate of the thirteenth TFT connected to the Q node, a drain of the thirteenth TFT receiving an Nth clock signal, and a source of the thirteenth TFT connected to the Nth scanning line; a fourteenth TFT, a gate of the fourteenth TFT connected to the P node, a drain of the fourteenth TFT connected to the Nth scanning line, and a source of the fourteenth TFT connected to a signal at low level.

In contrast to the prior art, a first switch circuit and a second switch circuit are added on the Nth scanning line of each GOA unit at each stage in the GOA circuit in the present invention. The first switch circuit is used for inputting a signal at high level to the Nth scanning line of the GOA unit at each stage before the display panel shows images. The second switch circuit is used for inputting an enabling signal to the Nth scanning line so as to turn on a thin-film transistor (TFT) in each pixel and for inputting a signal at high level to each pixel so as to clear the remaining charges in the capacitor of the pixels. Thus, the function of all gate on enables. The benefit of the function is that the display does not leak electricity when the black screen is woken up and that the stability of the circuit is enhanced at the same time.

BRIEF DESCRIPTION OF THE DRAWINGS

FIG. 5 shows a timing diagram of the GOA unit according to the second embodiment of the present invention.

FIG. 6 is a flowchart of a method for driving a GOA circuit according to one embodiment of the present invention.

DETAILED DESCRIPTION OF THE PREFERRED EMBODIMENTS

Figure 1:
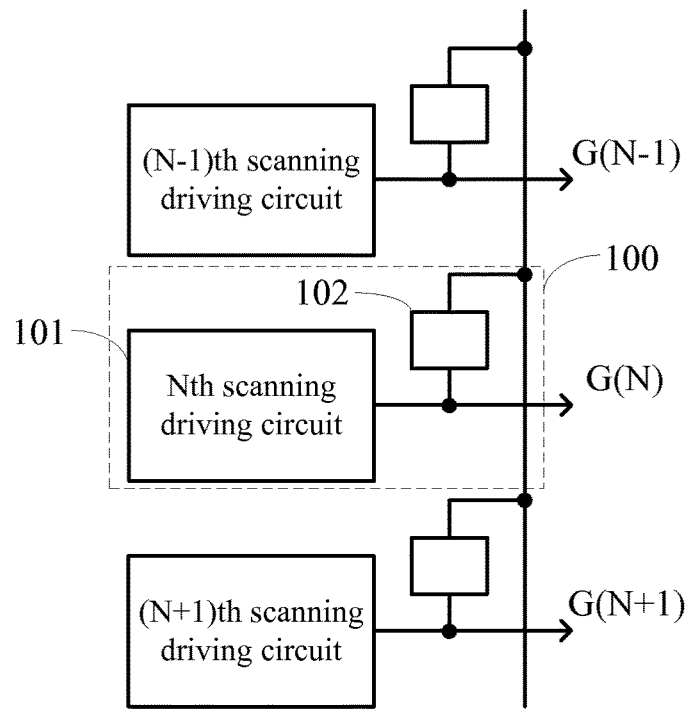
FIG. 1 shows a schematic diagram of the structure of a GOA circuit according to a first embodiment of the present invention.

Please refer to FIG. 1. FIG. 1 shows a schematic diagram of the structure of a GOA circuit according to a first embodiment of the present invention. The GOA circuit comprises a cascade of GOA units 100. An Nth GOA unit 100 comprises an Nth scanning driving circuit 101 and used for driving an Nth scanning line G(N) in a display section, provided that N is a positive integer. The Nth GOA unit 100 further comprises a first switch circuit 102. The first switch circuit 102 is connected to the Nth scanning line G(N) and used for responding to a first enabling signal Gas1 and being conducted before the LCD shows images. Also, the first switch circuit 102 is used for inputting an enabling signal to the Nth scanning line G(N) so as to turn on the TFT in a pixel which the Nth scanning line G(N) is connected to.

In another embodiment, the Nth GOA unit 100 further comprises a second switch circuit 103. The second switch circuit 103 is connected to the Nth scanning line G(N) and used for turning off the TFT in a pixel which the Nth scanning line G(N) is connected to when the first switch circuit 102 inputs a closing signal to the Nth scanning line G(N).

The Nth GOA unit 100 comprises the first switch circuit 102 and the second switch circuit 103. It means that the GOA unit 100 at each stage comprises both of the switch circuit 102 and the second switch circuit 103.

Refer to FIG. 1. Three GOA units 100 exemplify the concept of this embodiment. In reality, the number of GOA units 100 used in this embodiment is not limited. A gate of the GOA unit 100 at each stage in the GOA circuit is connected to the first switch circuit 102 and the second switch circuit 103 where the gate denotes the Nth scanning line G(N) in realizations. The first switch circuit 102 and the second switch circuit 103 are used for inputting an enabling signal to the gate successively so as to turning on the gate in each pixel when a black screen of the display is woken up.

Figure 2:
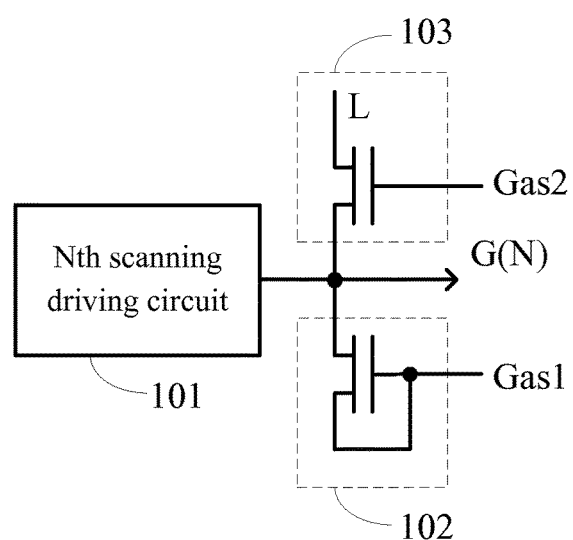
FIG. 2 shows a circuit diagram of the GOA unit according to the first embodiment of the present invention.

Please refer to FIG. 2. A first switch circuit 102 comprises a first TFT T1 according to one embodiment. A source of the first TFT T1 is connected to an Nth scanning line G(N). A gate of the first TFT T1 receives a first enabling signal Gas1 at high level before the LCD shows images so as to turn on the source of the first TFT T1 and a drain of the first TFT T1 and transmits a signal at high level to the Nth scanning line G(N). A second switch circuit 103 comprises a second TFT T2. A drain of the second TFT T2 is connected to the Nth scanning line G(N). The second switch circuit 103 receives a second enabling signal Gas2 at high level from a gate of the second TFT T2 so as to turn on the source of the second TFT T2 and a drain of the second TFT T2 and transmits a signal at low level to the Nth scanning line G(N) after transmitting a signal at high level to the Nth scanning line G(N). In this embodiment, the TFT in each pixel is an N-type transistor.

The first TFT T1 is an N-type transistor in this embodiment. The first TFT T1 is turned on at the stage of all gate on, when the first enabling signal Gas1 is at high level. The drain of the first TFT T1 is transmitted to the first enabling signal Gas1 to the source. Further, the Nth scanning line G(N) is also at high level; that is, the horizontal scanning line at the stage is conducted and receives the signal at low level. After the stage of all gate on, the first enabling signal Gas1 is at low level, and the first TFT T1 is turned off while the second enabling signal Gas2 is at high level, the second TFT T2 is turned on, and the Nth scanning line G(N) receives the signal at low level. This stage is called as a reset stage.

The operation of the GOA unit at each stage is the same at the all gate on stage and the reset stage. The first enabling signal Gas1 and the second enabling signal Gas2 can be shared by the GOA unit at each stage.

Provided that a first TFT T1 and a second TFT T2 in each pixel are a P-type transistors in another embodiment, a first enabling signal Gas1 and a second enabling signal Gas2 which a gate of the first TFT T1 and a gate of the second TFT T2 are connected to can exchange. No matter what type of TFT is used in each circuit and in each of the embodiments, the N-type TFT or the P-type can substituted for the other. The person skilled in the art can fabricate any other modified circuits based on the circuit proposed by the present invention. The specification will not elaborate on the details.

In contrast to the conventional technology, a first switch circuit and a second switch circuit are added on the Nth scanning line of each GOA unit at each stage in the GOA circuit in the present invention. The first switch circuit is used for inputting an enabling signal to the Nth scanning line G(N) of the GOA unit at each stage to turn on the TFT in each pixel before the display panel shows images and for inputting a signal at low level to each pixel. The second switch circuit is used for inputting a signal at low level to the Nth scanning line G(N) to clear the remaining charges in the capacitor of the pixels. Thus, the function of all gate on enables. The benefit of the function is that the display does not leak electricity when the black screen is woken up and that the stability of the circuit is enhanced at the same time.

Figure 3:
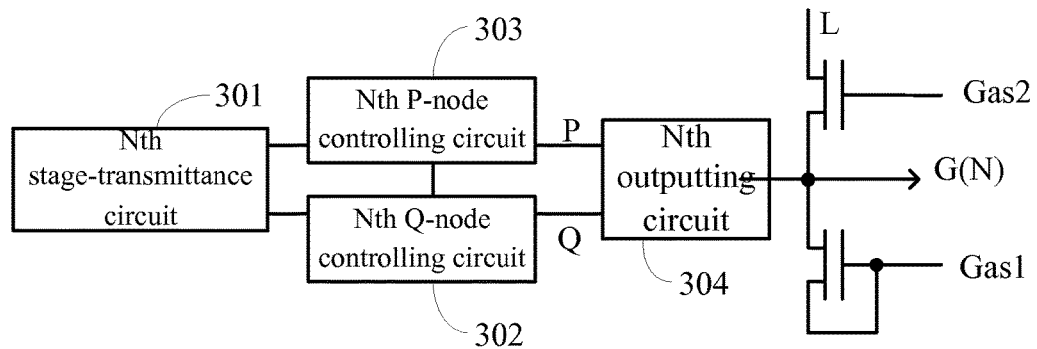
FIG. 3 shows a schematic diagram of the structure of a GOA circuit according to a second embodiment of the present invention.

Please refer to FIG. 3. FIG. 3 shows a schematic diagram of the structure of a GOA circuit according to a second embodiment of the present invention. The Nth scanning driving circuit comprises an Nth stage-transmittance circuit 301, an Nth Q-node controlling circuit 302, an Nth P-node controlling circuit 303, and an Nth outputting circuit 304.

The Nth stage-transmittance circuit 301 is connected to the Nth Q-node controlling circuit 302. The Nth Q-node controlling circuit 302 is connected to the Nth outputting circuit 304 via the Q node and used for pulling up the level of the Q node in the period of scanning so that the Nth outputting circuit 304 can output a scanning signal.

The Nth stage-transmittance circuit 301 is connected to the Nth P-node controlling circuit 303. The Nth P-node controlling circuit 303 is connected to the Nth outputting circuit 304 via the P node and used for pulling up the level of the P node in the period of non-scanning so that the Nth outputting circuit 304 can output a signal at low level.

Figure 4:
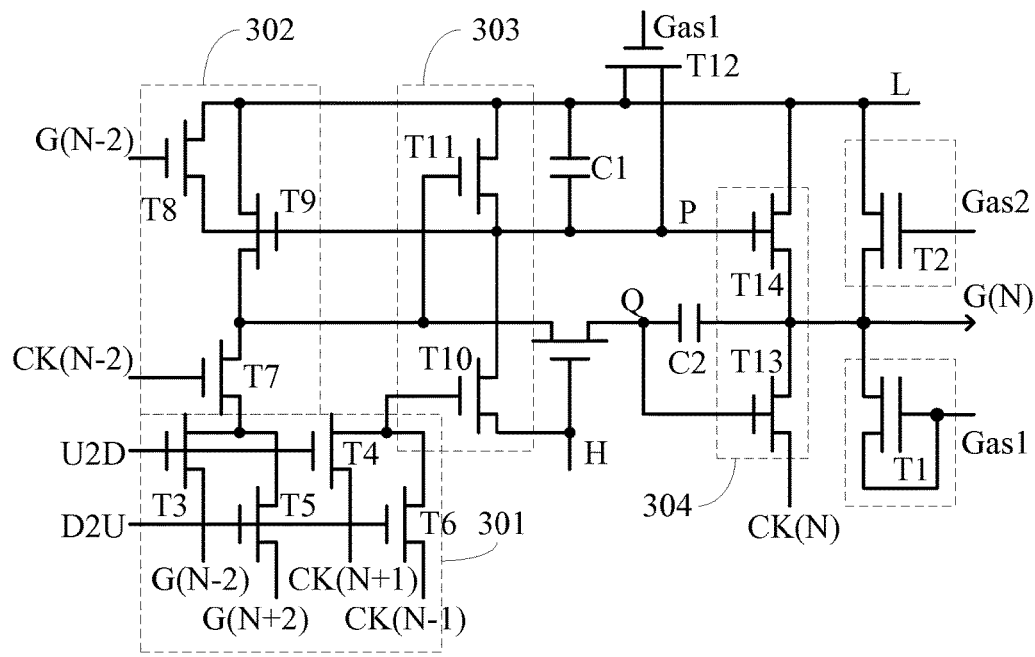
FIG. 4 shows a circuit diagram of the GOA unit according to the second embodiment of the present invention.

FIG. 4 shows a circuit diagram of the GOA circuit according to the second embodiment of the present invention. In a concrete circuit:

The Nth stage-transmittance circuit 301 comprises a third TFT T3, a fourth TFT T4, a fifth TFT T5, and a sixth TFT T6. A gate of the third TFT T3 and a gate of the fourth TFT T4 receive a forward scanning controlling signal U2D. The third TFT T3 is used for receiving an (N−2)th scanning signal G(N−2) in the period of forward scanning. Also, the fourth TFT T4 is used for receiving an (N+1)th clock signal CK(N+1). A gate of the fifth TFT T5 and a gate of the sixth TFT T6 receive a reverse scanning controlling signal D2U. The fifth TFT T5 is used for receiving an (N+2)th scanning signal G(N+2) in the period of reverse scanning. Also, the sixth TFT T6 is used for receiving an (N−1)th clock signal CK(N−1).

The Nth Q-node controlling circuit 302 comprises a seventh TFT T7, an eighth TFT T8, and a ninth TFT T9. A gate of the seventh TFT T7 receives an (N−2)th clock signal CK(N−2), a drain of the seventh TFT T7 receives an (N−2)th scanning signal G(N−2) in the period of forward scanning or receives an (N+2)th scanning signal G(N+2) in the period of reverse scanning, and a source of the seventh TFT T7 is connected to the Q node. A gate of the eighth TFT T8 receives an (N−2)th scanning signal G(N−2), a drain of the eighth TFT T8 is connected to the P node, and a source of the eighth TFT T8 receives a signal at low level. A gate of the ninth TFT T9 is connected to the drain of the eighth TFT T8, a drain of the ninth TFT T9 is connected to the source of the seventh TFT T7, and a source of the ninth TFT T9 is connected to a signal at low level.

The Nth P-node controlling circuit 303 comprises a tenth TFT T10 and an eleventh TFT T11. A gate of the tenth TFT T10 receives an (N+1)th clock signal CK(N+1) in the period of forward scanning or receives an (N−2)th clock signal CK(N−1) in the period of reverse scanning. A drain of the tenth TFT T10 receives a signal at high level. A source of the tenth TFT T10 is connected to the P node. A gate of the eleventh TFT T11 is connected to the Q node, a drain of the eleventh TFT T11 is connected to the P node, and a source of the eleventh TFT T11 receives a signal at low level.

The Nth P-node controlling circuit 303 further comprises a twelfth TFT T12. A gate of the twelfth TFT T12 receives the first enabling signal Gas1, a drain of the twelfth TFT T12 is connected to the P node, and a source of the twelfth TFT T12 receives a signal at low level.

The Nth outputting circuit 304 comprises a thirteenth TFT T13 and a fourteenth TFT T14. A gate of the thirteenth TFT T13 is connected to the Q node, a drain of the thirteenth TFT T13 receives the Nth clock signal CK(N), and a source of the thirteenth TFT T13 is connected to the Nth scanning line G(N). A gate of the fourteenth TFT T14 is connected to the P node, a drain of the fourteenth TFT T14 is connected to the Nth scanning line G(N), and a source of the fourteenth TFT T14 is connected to a signal at low level.

In FIG. 4, H denotes a signal at high level, and L denotes a signal at low level.

In the period of forward scanning, the forward scanning controlling signal U2D is at high level and the reverse scanning controlling signal D2U is at low level so that the third TFT T3 and the fourth TFT T4 are turned on while the fifth TFT T5 and the sixth TFT T6 are turned off. Thus, the Nth Q node 302 and the Nth P node 303 are connected to the (N−2)th scanning signal G(N−2) and receive the (N+1)th clock signal CK(N+1). In other embodiments, taking in the period of reverse scanning for example, the forward scanning controlling signal U2D is at low level and the reverse scanning controlling signal D2U is at high level so that the third TFT T3 and the fourth TFT T4 are turned off while the fifth TFT T5 and the sixth TFT T6 are turned on. Thus, the Nth Q node 302 and the Nth P node 303 are connected to the (N+2)th scanning signal G(N+2) and receive the (N−1)th clock signal CK(N−1).

Please refer to FIG. 5 as well. FIG. 5 is a sequence diagram of a circuit according to the second embodiment of the present invention. The circuit is elaborated in this embodiment. Take forward scanning for example.

In the first interzone (i.e., the period of all gate on), the first enabling signal Gas1 is at low level on the onset stage of the period of all gate on. The first enabling signal Gas1 is a signal at high level. The first TFT T1 is turned on. A signal at high level is input to the Nth scanning line G(N). The TFT in each pixel is turned on accordingly. At this stage, a touch signal is input to a signal line of the pixel to wake the black screen of the display up at any time. After the black screen is waken up, a signal at low level (i.e., voltage corresponding to black grey level) is input to the signal line of the pixel so as to discharge at the pixels and to clear the remaining charges at the pixels. Specifically, in the period of all gate on, the first enabling signal Gas1 is directly input to the Nth scanning line G(N) so any signal output by the Nth scanning line G(N) is constantly a signal at high level regardless of operation of the Nth scanning driving circuit.

In the second interzone (i.e., the reset interval), the first enabling signal Gas1 is at low level. Also, the first TFT T1 is turned off. The second enabling signal Gas2 is at high level. The second TFT T2 is turned on. A signal at low level L is input to the Nth scanning line G(N) so as to turn off the TFT in each pixel and reset the signal output through the Nth scanning line G(N). In the reset interval, the signal at low level L is directly input to the Nth scanning line G(N) so any signal output by the Nth scanning line G(N) is constantly a signal at low level regardless of operation of the Nth scanning driving circuit.

In the third interzone (i.e., normal display interval), both of the first enabling signal Gas1 and the second enabling signal Gas2 are at low level. Both of the first TFT T1 and the second TFT T2 are turned off. The signal output by the Nth scanning line G(N) is determined by the Nth stage-transmittance circuit 301, the Nth Q-node controlling circuit 302, the Nth P-node controlling circuit 303, and the Nth outputting circuit 304.

Specifically, when the (N−2)th clock signal CK(N−2) is at high level, the (N+1)th clock signal CK(N+1) is at low level. When the (N−2)th scanning signal G(N−2) is at high level, the eighth TFT T8 is turned on, and the P node is at low level. Accordingly, the fourteenth TFT T14 is turned off. Meanwhile, the seventh TFT T7 is turned on, the Q node is at high level, the thirteenth TFT T13 is turned on, and the Nth clock signal CK(N) is input to the Nth scanning line G(N), i.e., the signal at low level.

When the (N−2)th clock signal CK(N−2) is at low level, the (N+1)th clock signal CK(N+1) is at low level. When the (N−2)th scanning signal G(N−2) is at low level, both of the seventh TFT T7 and the eighth TFT T8 are turned off. The P node and the Q node keep the same; that is, the Q node is at high level, and the P node is at low level. The Nth clock signal CK(N) is input to the Nth scanning line G(N), i.e., the signal at low level.

When the (N−2)th clock signal CK(N−2) is at low level, the (N+1)th clock signal CK(N+1) is at low level. When the (N−2)th scanning signal G(N−2) is at low level, both of the seventh TFT T7 and the eighth TFT T8 are turned off. The P node and the Q node keep the same; that is, the Q node is at high level, and the P node is at low level. The Nth clock signal CK(N) is input to the Nth scanning line G(N), i.e., the signal at high level. The output of the current stage GOA unit is done.

In contrast to the prior art, a first switch circuit and a second switch circuit are added on the Nth scanning line G(N) of each GOA unit at each stage in the GOA circuit in the present invention. The first switch circuit is used for inputting a signal at high level to the Nth scanning line G(N) of the GOA unit at each stage before the display panel shows images. The second switch circuit is used for inputting an enabling signal to the Nth scanning line G(N) so as to turn on a thin-film transistor in each pixel and for inputting a signal at high level to each pixel so as to clear the remaining charges in the capacitor of the pixels. Thus, the function of all gate on enables. The benefit of the function is that the display does not leak electricity when the black screen is woken up and that the stability of the circuit is enhanced at the same time.

Please refer to FIG. 6. FIG. 6 is a flowchart of a method for driving a GOA circuit according to one embodiment of the present invention. The method applies to the GOA circuit in each of the embodiments mentioned above. The method comprises steps of:

Step S601: Turning on a first switch circuit in the GOA unit at each stage and inputting an enabling signal to the scanning line at each stage so that the TFT in the pixel connected to the scanning line at each stage is turned on.

Step S602: Turning off the switch circuit in the GOA unit at each stage and starting to scan the GOA unit from the first stage or from the last stage.

The method for driving the GOA circuit proposed by this embodiment is based on the GOA circuit mentioned in each of the above-mentioned embodiments. The details will not be elaborated in the specification.

Figure 7:
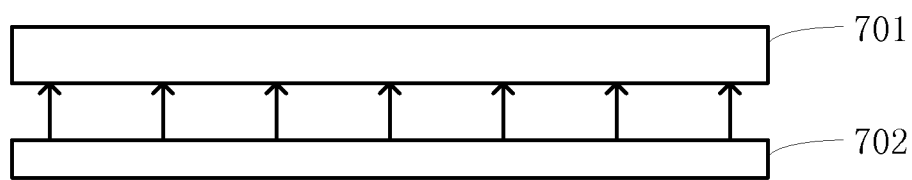
FIG. 7 is a schematic diagram of the structure of LCD according to one embodiment of the present invention.

Please refer to FIG. 7. FIG. 7 is a schematic diagram of the structure of LCD according to one embodiment of the present invention. The LCD comprises an LCD panel 701 and a backlight 702. The LCD panel 701 comprises a GOA circuit. The GOA circuit in this embodiment is the same as that described in each of the above-mentioned embodiments. The details are not elaborated here.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A gate on array (GOA) circuit for liquid crystal display (LCD), comprising: a plurality of GOA units connected in cascade, an Nth GOA unit comprising an Nth stage-transmittance circuit, an Nth Q-node controlling circuit, an Nth P-node controlling circuit, an Nth outputting circuit, and a first switch circuit where N is a positive integer;

wherein the Nth stage-transmittance circuit is connected to the Nth Q-node controlling circuit, the Nth Q-node controlling circuit is connected to the Nth outputting circuit via a Q node, the Nth stage-transmittance circuit is connected to the Nth P-node controlling circuit, the Nth P-node controlling circuit is connected to the Nth outputting circuit via a P node, and further, the Nth outputting circuit is connected to the Nth scanning line;

the first switch circuit connected to the Nth scanning line, for inputting an enabling signal to the Nth scanning line before the LCD shows images so as to turn on a thin-film transistor (TFT) in a pixel which the Nth scanning line is connected to, wherein the Nth Q-node controlling circuit comprises:

a seventh TFT, a gate of the seventh TFT receiving an (N−2)th clock signal, a drain of the seventh TFT receiving an (N−2)th scanning signal in a period of forward scanning or receiving an (N+2)th scanning signal in a period of reverse scanning, and a source of the seventh TFT connected to the Q node;

an eighth TFT, a gate of the eighth TFT receiving an (N−2)th scanning signal G(N−2), a drain of the eighth TFT connected to the P node, and a source of the eighth TFT receiving a signal at low level;

a ninth TFT, a gate of the ninth TFT connected to the drain of the eighth TFT, a drain of the ninth TFT connected to the source of the seventh TFT, and a source of the ninth TFT connected to a signal at low level.

2. The circuit of claim 1, wherein the first switch circuit comprises a first TFT, a source of the first TFT is connected to the Nth scanning line, a gate of the first TFT receives a first enabling signal at high level before the LCD shows images so as to turn on the source of the first TFT and a drain of the first TFT and transmits a signal at high level to the Nth scanning line so as to turn on the TFT in the pixel which the Nth scanning line is connected to.

3. The circuit of claim 1, wherein the GOA unit further comprises a second switch circuit;

the second switch circuit comprising a second TFT, a drain of the second TFT connected to the Nth scanning line, and the second switch circuit receiving a second enabling signal at high level from a gate of the second TFT so as to turn on the source of the second TFT and a drain of the second TFT and transmitting a signal at low level to the Nth scanning line after transmitting a signal at high level to the Nth scanning line so as to turn off the TFT in the pixel which the Nth scanning line is connected to.

4. The circuit of claim 1, wherein the Nth stage-transmittance circuit comprises a third TFT, a fourth TFT, a fifth TFT, and a sixth TFT;

a gate of the third TFT and a gate of the fourth TFT receiving a forward scanning controlling signal, for receiving an (N−2)th scanning signal through the third TFT in the period of forward scanning, and for receiving an (N+1)th clock signal through the fourth TFT;

a gate of the fifth TFT and a gate of the sixth TFT receiving a reverse scanning controlling signal, for receiving an (N+2)th scanning signal through the fifth TFT in the period of reverse scanning, and for receiving an (N−1)th clock signal through the sixth TFT.

5. The circuit of claim 1, wherein the Nth P-node controlling circuit comprises:

a tenth TFT, a gate of the tenth TFT receiving an (N+1)th clock signal in the period of forward scanning or receiving an (N−2)th clock signal in the period of reverse scanning, a drain of the tenth TFT receiving a signal at high level, and a source of the tenth TFT connected to the P node;

an eleventh TFT, a gate of the eleventh TFT connected to the Q node, a drain of the eleventh TFT connected to the P node, and a source of the eleventh TFT receiving a signal at low level.

6. The circuit of claim 5, wherein the Nth P-node controlling circuit further comprises:

a twelfth TFT, a gate of the twelfth receiving the first enabling signal, a drain of the twelfth connected to the P node, and a source of the twelfth TFT receiving a signal at low level.

7. The circuit of claim 1, wherein the Nth outputting circuit comprises:

a thirteenth TFT, a gate of the thirteenth TFT connected to the Q node, a drain of the thirteenth TFT receiving an Nth clock signal, and a source of the thirteenth TFT connected to the Nth scanning line;

a fourteenth TFT, a gate of the fourteenth TFT connected to the P node, a drain of the fourteenth TFT connected to the Nth scanning line, and a source of the fourteenth TFT connected to a signal at low level.

8. A liquid crystal display (LCD) comprising a gate on array (GOA) circuit, the GOA circuit comprising: a plurality of GOA units connected in cascade, an Nth GOA unit comprising an Nth stage-transmittance circuit, an Nth Q-node controlling circuit, an Nth P-node controlling circuit, an Nth outputting circuit, and a first switch circuit where N is a positive integer;

wherein the Nth stage-transmittance circuit is connected to the Nth Q-node controlling circuit, the Nth Q-node controlling circuit is connected to the Nth outputting circuit via a Q node, the Nth stage-transmittance circuit is connected to the Nth P-node controlling circuit, the Nth P-node controlling circuit is connected to the Nth outputting circuit via a P node, and further, the Nth outputting circuit is connected to the Nth scanning line;

the first switch circuit connected to the Nth scanning line, for inputting an enabling signal to the Nth scanning line before the LCD shows images so as to turn on a thin-film transistor (TFT) in a pixel which the Nth scanning line is connected to, wherein the Nth Q-node controlling circuit comprises:

a seventh TFT, a gate of the seventh TFT receiving an (N−2)th clock signal, a drain of the seventh TFT receiving an (N−2)th scanning signal in a period of forward scanning or receiving an (N+2)th scanning signal in a period of reverse scanning, and a source of the seventh TFT connected to the Q node;

an eighth TFT, a gate of the eighth TFT receiving an (N−2)th scanning signal G(N−2), a drain of the eighth TFT connected to the P node, and a source of the eighth TFT receiving a signal at low level;

a ninth TFT, a gate of the ninth TFT connected to the drain of the eighth TFT, a drain of the ninth TFT connected to the source of the seventh TFT, and a source of the ninth TFT connected to a signal at low level.

9. The LCD of claim 8, wherein the first switch circuit comprises a first TFT, a source of the first TFT is connected to the Nth scanning line, a gate of the first TFT receives a first enabling signal at high level before the LCD shows images so as to turn on the source of the first TFT and a drain of the first TFT and transmits a signal at high level to the Nth scanning line so as to turn on the TFT in the pixel which the Nth scanning line is connected to.

10. The LCD of claim 8, wherein the GOA unit further comprises a second switch circuit;

the second switch circuit comprising a second TFT, a drain of the second TFT connected to the Nth scanning line, and the second switch circuit receiving a second enabling signal at high level from a gate of the second TFT so as to turn on the source of the second TFT and a drain of the second TFT and transmitting a signal at low level to the Nth scanning line after transmitting a signal at high level to the Nth scanning line so as to turn off the TFT in the pixel which the Nth scanning line is connected to.

11. The LCD of claim 8, wherein the Nth stage-transmittance circuit comprises a third TFT, a fourth TFT, a fifth TFT, and a sixth TFT;

a gate of the third TFT and a gate of the fourth TFT receiving a forward scanning controlling signal, for receiving an (N−2)th scanning signal through the third TFT in the period of forward scanning, and for receiving an (N+1)th clock signal through the fourth TFT;

a gate of the fifth TFT and a gate of the sixth TFT receiving a reverse scanning controlling signal, for receiving an (N+2)th scanning signal through the fifth TFT in the period of reverse scanning, and for receiving an (N−1)th clock signal through the sixth TFT.

12. The LCD of claim 8, wherein the Nth P-node controlling circuit comprises:

a tenth TFT, a gate of the tenth TFT receiving an (N+1)th clock signal in the period of forward scanning or receiving an (N−2)th clock signal in the period of reverse scanning, a drain of the tenth TFT receiving a signal at high level, and a source of the tenth TFT connected to the P node;

an eleventh TFT, a gate of the eleventh TFT connected to the Q node, a drain of the eleventh TFT connected to the P node, and a source of the eleventh TFT receiving a signal at low level.

13. The LCD of claim 12, wherein the Nth P-node controlling circuit further comprises:

a twelfth TFT, a gate of the twelfth receiving the first enabling signal, a drain of the twelfth connected to the P node, and a source of the twelfth TFT receiving a signal at low level.

14. The LCD of claim 8, wherein the Nth outputting circuit comprises:

a thirteenth TFT, a gate of the thirteenth TFT connected to the Q node, a drain of the thirteenth TFT receiving an Nth clock signal, and a source of the thirteenth TFT connected to the Nth scanning line;

a fourteenth TFT, a gate of the fourteenth TFT connected to the P node, a drain of the fourteenth TFT connected to the Nth scanning line, and a source of the fourteenth TFT connected to a signal at low level.

* * * * *